United States Patent [19]
Bakhmutsky

[11] Patent Number: 5,666,116
[45] Date of Patent: Sep. 9, 1997

[54] HIGH SPEED VARIABLE-LENGTH DECODER ARRANGEMENT

[75] Inventor: Michael Bakhmutsky, Spring Valley, N.Y.

[73] Assignee: U.S. Philips Corporation, New York, N.Y.

[21] Appl. No.: 565,773

[22] Filed: Dec. 1, 1995

[51] Int. Cl.[6] .................................................. H03M 7/40
[52] U.S. Cl. ........................................................ 341/67
[58] Field of Search .................................. 341/63, 65, 67

[56] References Cited

U.S. PATENT DOCUMENTS

| | | | |
|---|---|---|---|
| 4,899,149 | 2/1990 | Kahan | 341/67 |
| 5,055,841 | 10/1991 | Cordell | 341/67 |
| 5,062,125 | 10/1991 | Langlais et al. | 341/67 |
| 5,173,695 | 12/1992 | Sun et al. | 341/67 |
| 5,181,031 | 1/1993 | Tong et al. | 341/65 |
| 5,208,593 | 5/1993 | Tong et al. | 341/65 |
| 5,245,338 | 9/1993 | Sun | 341/67 |
| 5,254,991 | 10/1993 | Ruetz et al. | 341/65 |
| 5,363,097 | 11/1994 | Jan | 341/67 |
| 5,491,480 | 2/1996 | Jan et al. | 341/67 |

*Primary Examiner*—Howard L. Williams
*Attorney, Agent, or Firm*—Edward W. Goodman

[57] ABSTRACT

A variable-length decoder arrangement having enhanced speed capacity, in which an input bit stream is tagged with the codeword boundary information by a tree searching state machine positioned in front of a tag buffer. This codeword boundary information, after having been windowed in a barrel shifter, is applied to a simple codeword-type-independent look-up table decoder coupled to an accumulator for generating the window shifting control signals for the above barrel shifter and for a barrel shifter receiving the codewords in the decoding section of the variable-length decoder. The enhanced speed is achieved by reducing the complexity and, therefore, the propagation delays of a length decoder, or eliminating it altogether.

7 Claims, 3 Drawing Sheets

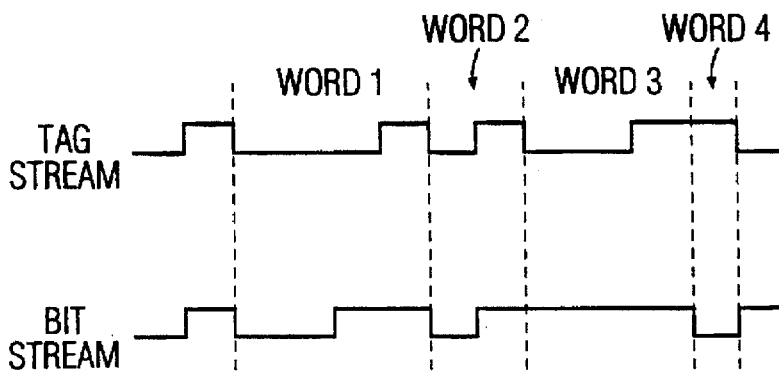
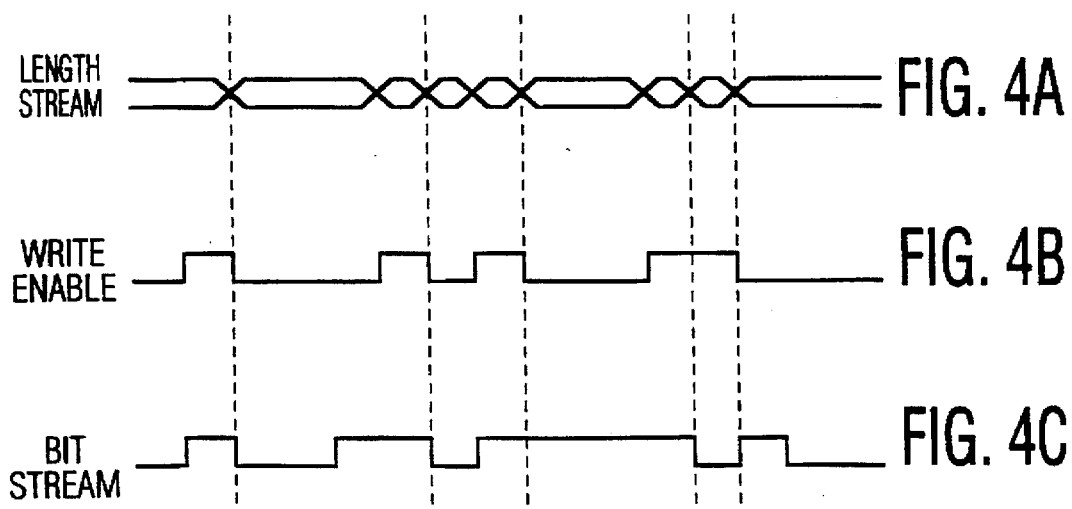

HIGH SPEED VARIABLE-LENGTH DECODER ARRANGEMENT

BACKGROUND OF THE INVENTION

1. Field of the Invention

The subject invention relates to a method and apparatus for decoding statistically encoded bit streams consisting of words having variable bit lengths.

Variable-length coding is a coding technique often used for lossless data compression. In accordance with this technique, fixed-length data is converted into variable-length codewords according to the statistics of the data. In general, the lengths of the codewords are chosen so that shorter codewords are used to represent the more frequently occurring data and longer codewords are chosen to represent the less frequently occurring data. By properly assigning the variable-length codewords to the library of all possible source codewords, the averaged word-length of the variable-length codewords is shorter than that of the original data and, therefore, data compression is achieved. The Huffman code design is a procedure commonly used to construct a minimum redundant variable-length code for a known data statistic. Generally, the encoding process can be implemented by a table look-up process using the input data to address the table. The codewords and word-lengths are stored as table contents, and the codewords are outputted sequentially, through a buffer, at a constant data rate onto the data channel. At the receiving end, however, the decoding process is more complicated. Due to the variable-length nature, each codeword has to be segmented from the received bit stream before it can be decoded into a source symbol. Therefore, the design of a variable-length decoder is always more difficult than the design of a variable-length encoder.

2. Description of the Related Art

There are several methods to decode a sequence of variable-length codewords. The most important ones are the tree-searching algorithm and the table look-up technique.

A variable-length code can always be represented by a tree with codewords as leaves (also called terminal nodes). The decoding starts from the root of the code tree and is guided by the received bit stream to follow one of two branches at each node. When a leaf is reached, the end of a codeword is detected and it is segmented from the remaining string. This type of decoder includes logic circuitry corresponding to the tree and control circuitry to traverse the code tree. This approach may be slow, especially for long codewords, since a bit-by-bit search through the code tree is required for each decoded symbol. In typical applications, an input symbol is represented by several bits. The speed of shifting received bits into a decoder is several times as high as the averaged speed of decoded data. Therefore, the tree-searching-based decoder has to be operated at the speed of several times the output data rate.

Such high speed requirements are particularly critical for the digital transmission of high definition television (HDTV) signals. In such an HDTV system, the total sample rate (combined luminance and chrominance signals) is likely to be 100 MHz.

A table look-up technique is an alternative to the bit-by-bit search approach. In a table look-up technique, the received bit stream is compared with the contents of a codeword table. The codeword table has an entry associated with each possible variable-length codeword that includes the decoded fixed length codeword and the length of the variable-length codeword. When the sequence of leading bits in an input register matches one of the entries in the codeword table, a codeword match is indicated. The input register is then shifted by the number of bits indicated by the code-length entry, thereby making the next sequence of bits available for comparison with entries in the codeword table. Disadvantageously, bit-by-bit shifting at the very high speed multiple of the sample rate is required to enable the decoder to maintain the sample rate of decoding.

A high-speed flexible variable-length-code decoder of the table look-up type includes a barrel shifter that provides an output decoding window having a bit-width equal to the maximum length codeword. In response to a control signal, the barrel shifter directly shifts its decoding window across a sequence of available input bits as each codeword is detected. The decoding window is shifted after each codeword is decoded by the number of bits corresponding to the length of the last decoded codeword. The table look-up decoder is capable of decoding at the symbol rate regardless of the word-length.

U.S. Pat. No. 5,173,695 to Sun et al., discloses a table look-up decoder of the above type. However, its actual speed of operation is limited by the propagation delay through the feedback loop consisting of the barrel shifter, the word-length decoder and the adder. The word-length decoder represents the most complex, and therefore, the slowest part of the path. In MPEG-2 applications, for example, there are multiple tables corresponding to particular types of codewords, which are not only complex by themselves, but their multiplexing and, sometimes, use of arithmetic operations, are required before the result of proper length computation is delivered to the adder.

In current implementations, the systems are normally partitioned into multiple processing paths, the variable-length decoder being one of the major bottlenecks. Since multiple variable-length decoders cannot access the rate buffer directly, multiple dedicated ping-pong buffers are normally implemented between all the variable-length decoders and the rate buffer, increasing the amount of the bit stream memory required for the system. For example, the system implemented in 8 partitions requires 8 ping-pong buffers, each one of these buffers having twice the size of the rate buffer, thereby increasing the amount of buffer memory by the factor of 16. For the duration of the picture, each one of these ping-pong buffers reads the picture partition designated for decoding by its variable-length decoder in the next picture cycle while the variable-length decoder is decoding the portion of the bit stream stored in the other bank of the ping-pong buffer.

SUMMARY OF THE INVENTION

An object of the invention is to enhance the speed of operation of the variable-length decoder by speeding up the word-length decoding loop. This results in much more efficient implementations, particularly using a single variable-length decoder per system. Furthermore, the single variable-length decoder will interface with the rate buffer directly thereby eliminating the intermediate ping-pong buffers and reducing the amount of the system bit stream memory.

This object is achieved in a variable-length decoder arrangement for decoding an input bit stream of variable-length codewords comprising a tree-searching state machine having a data input for receiving the input bit stream and an enable input for receiving an enable signal, said tree-searching state machine executing a decoding protocol and tagging the end of every codeword; a delay equalizer having a data input for receiving the input bit stream and an enable input for receiving the enable signal, said delay equalizer compensating for a delay of the tree-searching state machine; a first format converter having an input coupled to an output of said tree-searching state machine, and a second format converter having an input coupled to an output of said delay equalizer, said first and second format converters each bussing an applied data stream to a predetermined width for accommodating the longest codeword in a selected protocol; a tag buffer having an input coupled to an output of the first format converter; a rate buffer having an input coupled to an output of the second format converter; and a variable-length decoder having first input means coupled to an output of the tag buffer, and second input means coupled to an output of the rate buffer, the variable-length decoder comprising a closed-loop parsing loop having an input coupled to the first input means of said variable-length decoder, said closed-loop parsing loop comprising first register means having input means coupled to the input of said closed-loop parsing loop; a first barrel shifter having data input means coupled to output means of said first register means, and a shift-control input; a fixed tag-to-length conversion table decoder having an input coupled to an output of said first barrel shifter for receiving an input for said fixed tag-to-length conversion table decoder; an adder having a first input coupled to an output of said fixed tag-to-length conversion table decoder; and second register means having an input coupled to an output of said adder, said second register means having an output coupled to a second input of said adder, to the shift-control input of said first barrel shifter, and to an output of said closed-loop parsing loop; a decoding section having a first input coupled to the second input means of said variable-length decoder, and a second input coupled to the output of said closed-loop parsing loop, said decoding section comprising third register means having input means coupled to said first input of said decoding section; a second barrel shifter having data input means coupled to output means of said register means, and a shift control input coupled to said second input of said decoding section; and a value decoder having an input coupled to an output of said second barrel shifter, said value decoder interpreting a bit stream at the output of the second barrel shifter and converting the bit stream into actual data values, said value decoder having an output coupled to an output of the decoding section which constitutes an output of the variable-length decoder arrangement; and a state machine coupled to the decoding section and the closed-loop parsing loop for executing the decoding protocol based on the bit stream contents, the state machine controlling the value decoder by selecting appropriate decoding value tables for the value decoder and interrupting the data requests from the tag buffer and the rate buffer when a picture represented by the input bit stream is decoded.

The variable-length decoder speed enhancement is achieved by tagging the bit stream before the rate buffer with the codeword boundary information and by replacing the slowest part of the critical length decoding loop with a simple fixed look-up table decoder, or eliminating this loop altogether.

As in the prior art, a look-up table decoder with a barrel shifter is used. However, the subject invention takes advantage of the fact that the lengths of the codewords can be easily determined before the bit stream is entered into the rate buffer. The variable-length decoder used after the rate buffer has to be able to decode codewords at very high peak rates since, for the actual display time of the picture, it may have to extract the whole picture from the rate buffer, which may have even more codewords than there are samples in the picture. This problem is especially severe in HDTV applications where the amount of information passed through the decoding circuits is very high.

It should be understood that the variable-length decoder may be used in front of a buffer, at which point such a demanding peak codeword rate requirement does not exist. As such, the variable-length decoder may run at a much slower rate. However, the uncompressed decoded information at the output of the variable-length decoder requires much more memory in the buffer, which is a significant cost factor for the HDTV set. This is why variable-length decoders are normally used after a rate buffer, as in the current invention.

Since there is no peak codeword rate requirement for bit stream decoding before the rate buffer, a relatively slow state machine can be used in front of the rate buffer whose only purpose is to mark the word boundaries of the bit stream. This information can be passed to the variable-length decoder, used after the rate buffer, along with the bit stream, easing its task of word-length computation.

A further object of the invention is to provide a variable-length decoder capable of attaining extremely high speed at the expense of cost.

This object is achieved in a variable-length decoder arrangement for decoding an input bit stream of variable-length codewords, comprising a tree-searching state machine having a data input for receiving the input bit stream and an enable input for receiving an enable signal, said tree-searching state machine executing a decoding protocol and tagging the end of every codeword in said input bit stream; a serial memory having an input coupled to an output of said tree-searching state machine; a format converter having a data input for also receiving said input bit stream, and an enable input for also receiving said enable signal, said format converter bussing said input bit stream to a predetermined width for accommodating the longest codeword in a selected protocol; a rate buffer having an input coupled to an output of the format converter; and a variable-length decoder having first input means coupled to an output of said serial memory, and second input means coupled to an output of said rate buffer, said variable-length decoder comprising an open-loop parsing loop having an input coupled to the first input means of said variable-length decoder, said open-loop parsing loop comprising an adder having a first input coupled to the input of the open-loop parsing loop; and first register means having an input coupled to an output of said adder, an output of said first register means being coupled to a second input of said adder, and to an output of said open-loop parsing loop; a decoding section having a first input coupled to the second input means of said variable-length decoder, and a second input coupled to the output of said open-loop parsing loop, said decoding section comprising second register means coupled to said first input of said decoding section; a barrel shifter having data input means coupled to an output of said second register means, and a shift-control input coupled to said second input of said decoding section; and a value decoder having an input coupled to an output of said barrel shifter, said value decoder interpreting a bit stream at the output of the barrel shifter and converting the bit stream into actual data values, said value decoder having an output coupled to an output of the decoding section which constitutes an output of the variable-length decoder arrangement; and a state machine coupled to the decoding section and the open-loop parsing loop for executing the decoding protocol based on the bit stream contents, the state machine controlling the value decoder by selecting appropriate decoding value tables for the value decoder and interrupting the data requests from the tag buffer and the rate buffer when a picture represented by the input bit stream is decoded.

BRIEF DESCRIPTION OF THE DRAWINGS

With the above and additional objects and advantages in mind as will hereinafter appear, the invention will be described with reference to the accompanying drawings, in which:

FIGS. 2A and 2B show timing diagrams of the bit stream at the output of the tree-searching state machine, and the delayed input bit stream in FIG. 1;

FIGS. 4A–4C show timing diagrams of the parallel word length stream and the write enable signal at outputs of the tree-searching state machine, and the input bit stream in FIG. 3.

DESCRIPTION OF THE PREFERRED EMBODIMENTS

Figure 1:
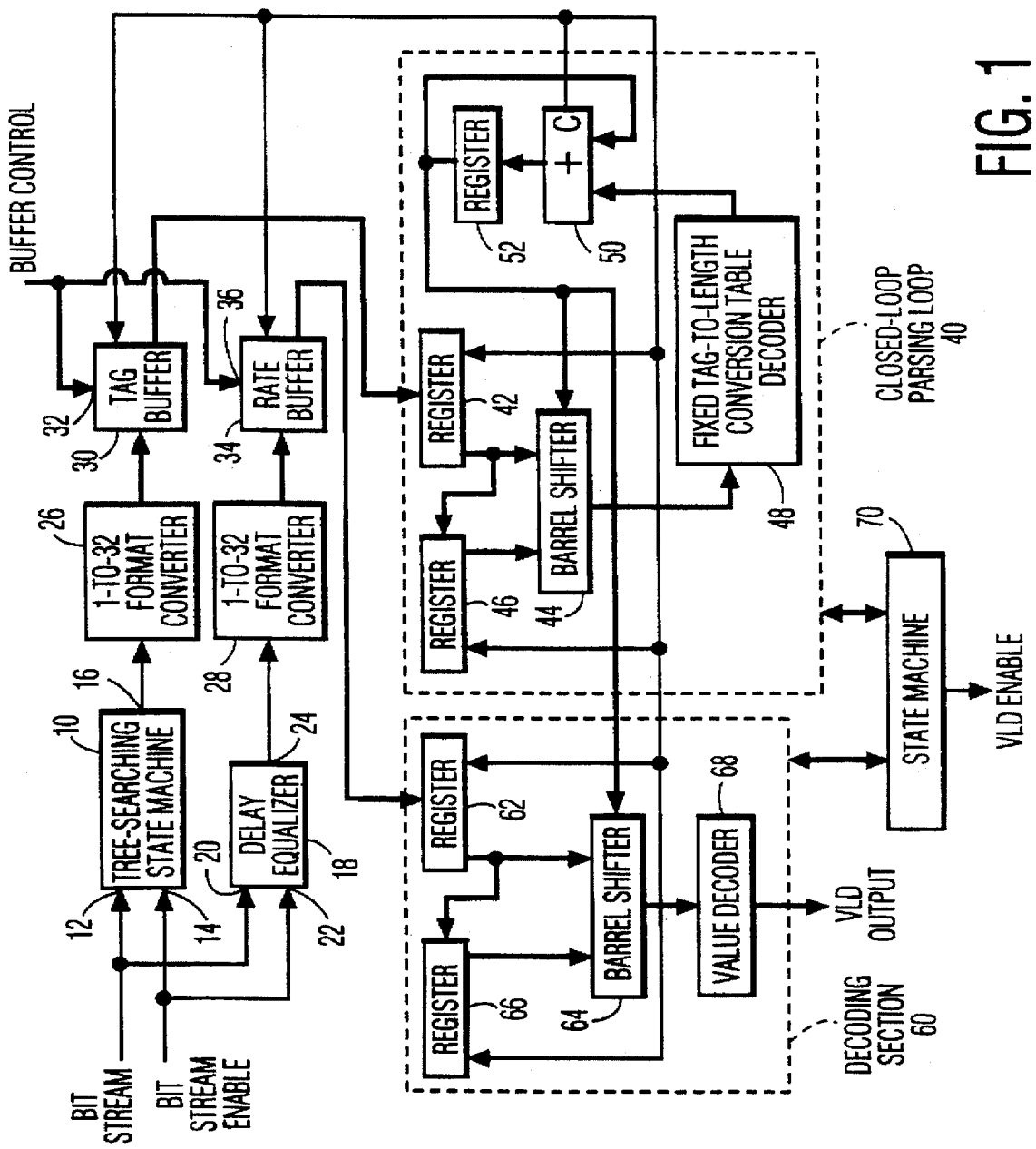
FIG. 1 is a block diagram of a first embodiment of the variable-length decoder arrangement of the subject invention.

FIG. 1 shows a closed loop implementation of the variable-length decoder arrangement of the subject invention. In particular, a tree-searching state machine 10 receives, at its data input 12, an input bit stream and, at an enable input 14, a bit stream enable signal. The bit stream has a width of 1 bit for easier implementation. The bit stream is valid only when the enable signal is active. This is necessary to accommodate for burstiness in the data due to prior processing in the transport circuits (not shown). The tree-searching state machine 10, controlled by the bit stream, executes a decoding protocol, tagging the end of every codeword with, for example, an active "high" level at its single output 16. To compensate for a few clock cycles of delay in the tree-searching state machine 10, the input bit stream is also applied to a data input 20 of a delay equalizer 18, which also has an enable input 22 to which the bit stream enable signal is applied. At the output 24 of the delay equalizer 18 and at the output 16 of the tree-searching state machine 10, both bit streams are aligned in time as shown in the timing diagrams of FIGS. 2A and 2B. It should be noted that while the bit stream enable signal is required by subsequent components in the variable-length decoder arrangement, for clarity, the bit stream enable signal is only shown in FIG. 1 applied to the tree-searching state machine 10 and the delay equalizer 18.

The outputs from the tree-searching state machine 10 and the delay equalizer 18 are applied to respective 1-to-32 format converters 26 and 28. The 1-to-32 format converters 26 and 28 buss the respective bit streams for proper processing by the variable-length decoder. The widths of the bussed streams must be able to accommodate the longest codeword in the protocol for proper operation of the barrel shifter-based variable-length decoder. In the MPEG-2 protocol, this number is 32.

The outputs from the 1-to-32 format converters 26 and 28 are applied, respectively, to a tag buffer 30 and a rate buffer 34. The tag buffer 30 and the rate buffer 34 receive buffer control signals at respective control inputs 32 and 36 from buffer control circuits (not shown).

The variable-length decoder consists of two sections, a closed-loop parsing loop 40 and a decoder section 60. The closed-loop parsing loop 40 includes a register 42 to which the output from the tag buffer 30 is applied. The output from register 42 is applied to a first set of parallel inputs of a barrel shifter 44. The output from register 42 is also applied to a register 46, the output therefrom being applied to a second set of parallel inputs of the barrel shifter 44. The output from the barrel shifter 44 is applied to an input of a fixed tag-to-length conversion table decoder 48, in which the tag stream from the output of the barrel shifter 44 is converted into the actual word lengths. The fixed tag-to-length conversion table decoder 48 is a codeword-type-independent look-up table, in which the table does not depend on a type of currently decoded codeword, since the decoding is done earlier. The idea is to make this table decoder simple, fixed and independent of the actual bit stream. The data output from the fixed tag-to-length conversion table decoder 48 is applied to a first input of an adder 50, the output from the adder 48 being applied to a register 52. The output from the register 52 is applied to a second input of the adder 50, to the shift control input of the barrel shifter 44, and to the output of the closed-loop parsing loop 40. An overflow output C of the adder 50 is applied to the tag buffer 30, the rate buffer 34, and the registers 42 and 46 for controlling the timing of the arrangement.

The closed-loop parsing loop 40 is dedicated to controlling the barrel shifter 44 therein (and one in the decoding section 60) and requesting new data from the tag buffer 30 and the rate buffer 34. The barrel shifters are controlled in such a way that the sliding decoding windows always contain the current codeword in the decoding section 60 and the aligned codeword boundary tag stream in the closed-loop parsing loop 40.

Since the codeword boundary information is available in the closed-loop parsing loop 40 in the form of bits set "high" at the end of each codeword in the bit stream, it is very easy to convert this information into the actual word-lengths using the fixed tag-to-length conversion table decoder 48, as shown in Table I:

TABLE I

| WORD BOUNDARY TAG STREAM AT THE OUTPUT OF BARREL SHIFTER 46 | | CODE-WORD |
|---|---|---|
| 1XXXXXXXXXXXXXXXXXXXXXXXXXXXXXXXX | => | 1 |
| 01XXXXXXXXXXXXXXXXXXXXXXXXXXXXXXX | => | 2 |
| 001XXXXXXXXXXXXXXXXXXXXXXXXXXXXXX | => | 3 |
| 0001XXXXXXXXXXXXXXXXXXXXXXXXXXXXX | => | 4 |
| 00001XXXXXXXXXXXXXXXXXXXXXXXXXXXX | => | 5 |
| 000001XXXXXXXXXXXXXXXXXXXXXXXXXXX | => | 6 |
| 0000001XXXXXXXXXXXXXXXXXXXXXXXXXX | => | 7 |
| 00000001XXXXXXXXXXXXXXXXXXXXXXXXX | => | 8 |
| 000000001XXXXXXXXXXXXXXXXXXXXXXXX | => | 9 |
| 0000000001XXXXXXXXXXXXXXXXXXXXXXX | => | 10 |
| 00000000001XXXXXXXXXXXXXXXXXXXXXX | => | 11 |
| 000000000001XXXXXXXXXXXXXXXXXXXXX | => | 12 |
| 0000000000001XXXXXXXXXXXXXXXXXXXX | => | 13 |
| 00000000000001XXXXXXXXXXXXXXXXXXX | => | 14 |
| 000000000000001XXXXXXXXXXXXXXXXXX | => | 15 |
| 0000000000000001XXXXXXXXXXXXXXXXX | => | 16 |
| 00000000000000001XXXXXXXXXXXXXXXX | => | 17 |
| 000000000000000001XXXXXXXXXXXXXXX | => | 18 |
| 0000000000000000001XXXXXXXXXXXXXX | => | 19 |
| 00000000000000000001XXXXXXXXXXXXX | => | 20 |
| 000000000000000000001XXXXXXXXXXXX | => | 21 |
| 0000000000000000000001XXXXXXXXXXX | => | 22 |
| 00000000000000000000001XXXXXXXXXX | => | 23 |
| 000000000000000000000001XXXXXXXXX | => | 24 |
| 0000000000000000000000001XXXXXXXX | => | 25 |

TABLE I-continued

| WORD BOUNDARY TAG STREAM AT THE OUTPUT OF BARREL SHIFTER 46 | | CODE-WORD |
|---|---|---|
| 0000000000000000000000001XXXXXX | => | 26 |
| 00000000000000000000000001XXXXX | => | 27 |
| 000000000000000000000000001XXXX | => | 28 |
| 0000000000000000000000000001XXX | => | 29 |
| 00000000000000000000000000001XX | => | 30 |
| 000000000000000000000000000001X | => | 31 |
| 0000000000000000000000000000001 | => | 0 |

According to Table I, the length of a codeword is determined by the first "high" bit after an uninterrupted series of "low" bits. For example, the codeword whose tag stream starts with "0001 . . . " will have the length of four bits, "1" being the tag identifying the end of the codeword. Due to the wrap around nature of the barrel shifter 44, 32 is equivalent to 0.

The tag-to-length conversion table is not dependent on the bit stream information and can easily be implemented in silicon with minimal propagation delays. No multiplexing of word-length tables or arithmetic operations are required.

The decoding section 60 includes a register 62 for receiving the bit stream at the output of the rate buffer 34. An output from the register 62 is applied to a first set of data inputs of a barrel shifter 64, and to an input of a register 66, the output therefrom being applied to a second set of data inputs of barrel shifter 64. The output from the closed-loop parsing loop 40 (originating from the register 52) is applied to a shift control input of the barrel shifter 64. The decoding section 60 does not require a feedback loop. Rather, the output from the barrel shifter 64 is applied directly to a value decoder 68 which interprets the bit stream by converting it into the actual data values. This process is not timing critical and, as such, can be pipelined. It should be noted that the overflow output C of the adder 50 is also applied to the registers 62 and 66 for controlling the timing thereof.

The output from the value decoder 68 forms the output of the decoding section 60 and, accordingly, the output of the variable-length decoder arrangement of the subject invention.

The closed-loop parsing loop 40 and the decoding section 60 are controlled by a state machine 70 which executes the decoding protocol based on the bit stream contents. The state machine 70 controls the value decoder 68 by selecting its appropriate decoding value tables and interrupts the data requests from the tag buffer 30 and the rate buffer 34 when the picture is decoded.

Figure 3:
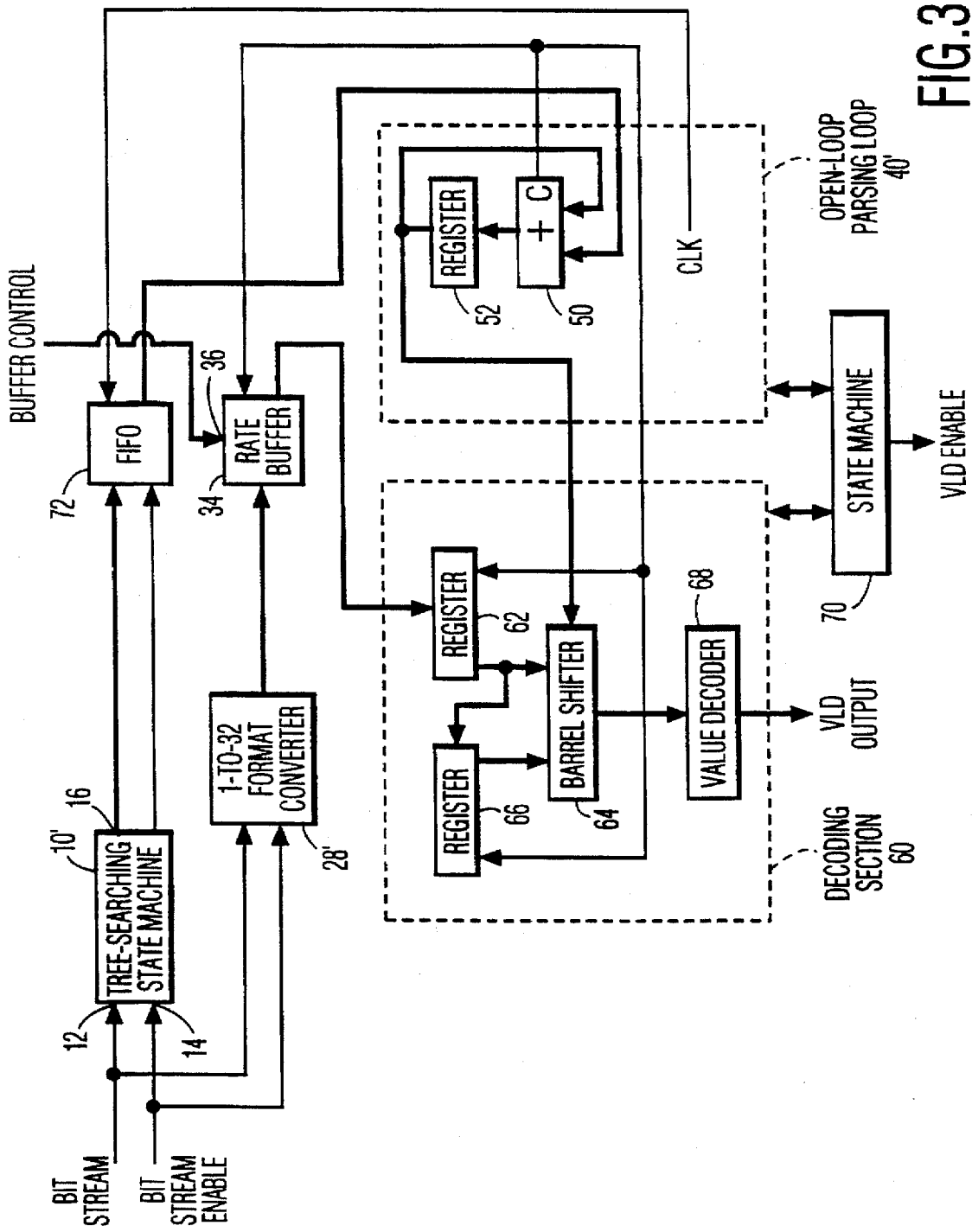
FIG. 3 shows a block diagram of a second embodiment of the variable-length decoder arrangement of the subject invention.

If speed is a priority over cost, extremely high data rates can be achieved by actually eliminating the closed-loop parsing loop 40 of FIG. 1. FIG. 3 shows an open-loop implementation of the variable-length decoder arrangement of FIG. 1, in which components identical to those in FIG. 1 bear the same reference number. In particular, the tree-searching state machine 10' now outputs the sequence of word-lengths along with the bit stream enable signal, and applies these two signals to a serial memory, for example, first-in-first-out (FIFO) memory 72. The input bit stream and the input bit stream enable signal are directly applied to 1-to-32 format converter 28'. The output from the FIFO memory 72 is applied directly to the first input of adder 50 in the open-loop parsing loop 40'.

The tree-searching state machine 10' outputs actual 5-bit word-lengths as soon as the codewords are decoded. These word-lengths are stored in the FIFO memory 72. The overall memory size of the FIFO memory 72 is not much larger than the size of the tag buffer 30 of FIG. 1 due to the fact that the number of word-lengths stored in the FIFO 72 is 3 to 5 times less than the number of bits stored in the tag buffer 30.

The word-lengths are now readily available to the variable-length decoder in parallel form and do not require any additional decoding. The consecutive readings of the FIFO memory 72 by the adder-accumulator circuit (adder 50 and register 52) every clock cycle will move the word pointer from word to word. Applying a FIFO word-length to the adder 50 has the same effect on the word pointer as reading a tag stream passed through the registers 42 and 46, the barrel shifter 44 and the fixed tag-to-length conversion table decoder 48, described with reference to FIG. 1. As before, the rate buffer 34 reading occurs at the overflow of adder 50, and the state machine 70 is used to manage the decoding process.

For better correlation between the bit stream and the parallel word-length stream, an additional control signal may be written into the FIFO memory 72, for example, a "Start Code Marker" (not shown). This signal may be used to restore synchronization between the bit stream and the parallel word length stream if necessary.

Eliminating the closed-loop parsing loop in the variable-length decoder opens the door to extremely high speeds of operation. The speed of operation in this application is defined only by the read cycle of the FIFO memory 72 plus a propagation delay through the 5-bit adder (50). The speed of the tree-searching state machine 10' does not represent a significant problem because it is required to run at much lower clock rates.

Numerous alterations and modifications of the structure herein disclosed will present themselves to those skilled in the art. However, it is to be understood that the above described embodiment is for purposes of illustration only and not to be construed as a limitation of the invention. All such modifications which do not depart from the spirit of the invention are intended to be included within the scope of the appended claims.

What is claimed is:

1. A variable-length decoder arrangement for decoding an input bit stream of variable-length codewords comprising:

a tree-searching state machine having a data input for receiving the input bit stream and an enable input for receiving an enable signal, said tree-searching state machine executing a decoding protocol and tagging the end of every codeword;

a delay equalizer having a data input for receiving the input bit stream and an enable input for receiving the enable signal, said delay equalizer compensating for a delay of the tree-searching state machine;

a first format converter having an input coupled to an output of said tree-searching state machine, and a second format converter having an input coupled to an output of said delay equalizer, said first and second format converters each bussing an applied data stream to a predetermined width for accommodating the longest codeword in a selected protocol;

a tag buffer having an input coupled to an output of the first format converter;

a rate buffer having an input coupled to an output of the second format converter; and a variable-length decoder having first input means coupled to an output of the tag buffer, and second input means coupled to an output of the rate buffer, the variable-length decoder comprising:

a closed-loop parsing loop having an input coupled to the first input means of the variable-length decoder, said closed-loop parsing loop comprising:

first register means having input means coupled to the input of said closed-loop parsing loop;

a first barrel shifter having data input means coupled to output means of said first register means, and a shift-control input;

a fixed-tag-to-length conversion table decoder having an input coupled to an output of said first barrel shifter for receiving an input for said fixed tag-to-length conversion table decoder;

an adder having a first input coupled to an output of said fixed tag-to-length conversion table decoder; and second register means having an input coupled to an output of said adder, said second register having an output coupled to a second input of said adder, to the shift-control input of said first barrel shifter, and to an output of said closed-loop parsing loop;

a decoding section having a first input coupled to the second input means of said variable-length decoder, and a second input coupled to the output of said closed-loop parsing loop, said decoding section comprising:

third register means having input means coupled to said first input of said decoding section;

a second barrel shifter having data input means coupled to an output of said register means, and a shift-control input coupled to said second input of said decoding section; and a value decoder having an input coupled to an output of said second barrel shifter, said value decoder interpreting a bit stream at the output of the second barrel shifter and converting the bit stream into actual data values, said value decoder having an output coupled to an output of the decoding section which constitutes an output of the variable-length decoder arrangement; and a state machine coupled to the decoding section and the closed-loop parsing loop for executing the decoding protocol based on the bit stream contents, the state machine controlling the value decoder by selecting appropriate decoding value tables for the value decoder and interrupting the data requests from the tag buffer and the rate buffer when a picture represented by the input bit stream is decoded.

2. The variable-length decoder arrangement as claimed in claim 1, wherein the first register means comprises:

a first register having input means coupled to the input of said closed-loop parsing loop; and a second register having input means coupled to an output of said first register, said input means of said barrel shifter comprising a first set of inputs coupled to the output of said first register, and a second set of inputs coupled to an output of said second register.

3. The variable-length decoder arrangement as claimed in claim 1, wherein the third register means comprises:

a first register having input means coupled to the first input of said decoding section; and a second register having input means coupled to an output of said first register, said input means of said second barrel shifter comprising a first set of inputs coupled to the output of said first register, and a second set of inputs coupled to an output of said second register.

4. The variable-length decoder arrangement as claimed in claim 1, wherein said first and second format converters are 1- to-32 format converters.

5. A variable-length decoder arrangement for decoding an input bit stream of variable-length codewords comprising:

a tree-searching state machine having a data input for receiving the input bit stream and an enable input for receiving an enable signal, said tree-searching state machine executing a decoding protocol and tagging the end of every codeword in said input bit stream;

a serial memory having an input coupled to an output of said tree-searching state machine;

a format converter having a data input for receiving said input bit stream, and an enable input for receiving said enable signal, said format converter bussing said input bit stream to a predetermined width for accommodating the longest codeword in a selected protocol;

a rate buffer having an input coupled to an output of the format converter; and a variable-length decoder having first input means coupled to an output of said serial memory, and second input means coupled to an output of said rate buffer, said variable-length decoder comprising:

an open-loop parsing loop having an input coupled to the first input means of said variable-length decoder, said open-loop parsing loop comprising:

an adder having a first input coupled to the input of the open-loop parsing loop; and first register means having an input coupled to an output of said adder, an output of said first register means being coupled to a second input of said adder, and to an output of said open-loop parsing loop;

a decoding section having a first input coupled to the second input means of said variable-length decoder, and a second input coupled to the output of said open-loop parsing loop, said decoding section comprising:

second register means coupled to said first input of said decoding section;

a barrel shifter having data input means coupled to an output of said second register means, and a shift-control input coupled to said second input of said decoding section; and a value decoder having an input coupled to an output of said barrel shifter, said value decoder interpreting a bit stream at the output of the barrel shifter and converting the bit stream into actual data values, said value decoder having an output coupled to an output of the decoding section which constitutes an output of the variable-length decoder arrangement; and a state machine coupled to the decoding section and the open-loop parsing loop for executing the decoding protocol based on the bit stream contents, the state machine controlling the value decoder by selecting appropriate decoding value tables for the value decoder and interrupting the data requests from the tag buffer and the rate buffer when a picture represented by the input bit stream is decoded.

6. The variable-length decoder arrangement as claimed in claim 5, wherein the second register means comprises:

a first register having input means for receiving the output from the rate buffer; and a second register having input means coupled to an output of said first register, said input means of said barrel shifter comprising a first set of inputs coupled to the output of said first register, and a second set of inputs coupled to an output of said second register.

7. The variable-length decoder arrangement as claimed in claim 5, wherein said format converter is a 1-to-32 format converter.

* * * * *